United States Patent
Röhr et al.

(10) Patent No.: US 6,392,445 B2
(45) Date of Patent: May 21, 2002

(54) DECODER ELEMENT FOR PRODUCING AN OUTPUT SIGNAL HAVING THREE DIFFERENT POTENTIALS

(75) Inventors: Thomas Röhr, Yokohama (JP); Heinz Hönigschmid, East Fishkill, NY (US); Zoltan Manyoki, Kanata (CA); Thomas Böhm, Zorneding; Georg Braun, München, both of (DE); Ernst Neuhold, Graz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/822,027

(22) Filed: Mar. 29, 2001

Related U.S. Application Data

(63) Continuation of application No. PCT/DE99/02308, filed on Jul. 28, 1999.

(30) Foreign Application Priority Data

Sep. 29, 1998 (DE) .......................... 198 44 728

(51) Int. Cl.$^7$ ................................................. G11C 8/00
(52) U.S. Cl. .................... 326/105; 326/106; 326/59; 326/60
(58) Field of Search ................................ 326/105, 106, 326/108, 112, 119, 121, 59, 60

(56) References Cited

U.S. PATENT DOCUMENTS

| | | | | |
|---|---|---|---|---|
| 4,038,564 A | * | 7/1977 | Hakata | ..................... 307/205 |
| 4,499,388 A | * | 2/1985 | Adam | ..................... 307/474 |
| 5,274,278 A | | 12/1993 | Bauer et al. | |

FOREIGN PATENT DOCUMENTS

| | | |
|---|---|---|
| EP | 0 436 984 A1 | 7/1991 |
| EP | 0 760 516 A2 | 3/1997 |
| WO | WO 00/16399 | 3/2000 |

\* cited by examiner

*Primary Examiner*—Michael Tokar
*Assistant Examiner*—Anh Q. Tran
(74) *Attorney, Agent, or Firm*—Laurence A. Greenberg; Werner H. Stemer; Gregory L. Mayback

(57) ABSTRACT

The decoder element is used for producing an output signal having three different potentials at an output. The second potential is situated between the first potential and the third potential. The decoder element makes it possible to produce any one of the three potentials at its output based upon the potentials on its connections.

9 Claims, 5 Drawing Sheets

| 1 | 2 | 4 | WLi |
|---|---|---|---|
| $\leq 4V+U_T$ | $\leq 4V+U_T$ | 4V | 0V |
| 4V | -2V | -2V | 4V |
| -2V | 4V | -2V | -2V |

| 1 | 2 | 3 | 4 | WLi |
|---|---|---|---|---|
| $\leq 4V+U_T$ | $\leq 4V+U_T$ | X | 4V | 0V |
| 4V | -2V | -2V | -2V | 4V |
| -2V | 4V | -2V | -2V | -2V |
| -2V | 4V | 0V | -2V | 0V |

DECODER ELEMENT FOR PRODUCING AN OUTPUT SIGNAL HAVING THREE DIFFERENT POTENTIALS

CROSS-REFERENCE TO RELATED APPLICATION

This application is a continuation of copending International Application No. PCT/DE99/02308, filed Jul. 28, 1999, which designated the United States.

BACKGROUND OF THE INVENTION

Field of the Invention

The invention relates to a decoder element for producing an output signal having three different potentials.

SUMMARY OF THE INVENTION

It is accordingly an object of the invention to provide a decoder element that produces an output signal having three different potentials at an output based upon input signals.

With the foregoing and other objects in view there is provided, in accordance with the invention a decoder element having an output for providing an output signal with three different potentials which include a first potential, a second potential, and a third potential. The second potential is between the first potential and the third potential. The decoder element includes a first circuit node connected to the output and a second circuit node. A first transistor of a first conduction type and a second transistor of a second conduction type are connected together through the first circuit node. The first transistor has a control connection and the second transistor has a control connection. The decoder element includes a first connection connected, through the first transistor and the second transistor, to a voltage having the second potential. A third transistor of the first conduction type and a fourth transistor of the second conduction type are connected together through the second circuit node. The third transistor has a control connection, the fourth transistor has a control connection connected to the output. The decoder includes a second connection and a third connection. The second connection is connected, through the third transistor and the fourth transistor, to the third connection. The decoder includes a fourth connection connected to the control connection of the first transistor, the control connection of the second transistor, and the control connection of the third transistor. The decoder also includes a fifth transistor of the second conduction type connected between the output and the third connection. The fifth transistor has a control connection connected to the second circuit node.

In accordance with an added feature of the invention, a voltage having the third potential is connected to the second connection; a voltage having the first potential is connected to the first connection, the third connection, and the fourth connection; and the output signal has the first potential.

In accordance with an additional feature of the invention, the first transistor has a threshold voltage and the second transistor has a threshold voltage; a voltage is connected to the first connection that has a potential that is lower than the third potential plus the threshold voltage of the first transistor; a voltage is connected to the second connection that has a potential that is lower than the third potential plus the threshold voltage of the third transistor; a voltage having the third potential is connected to the fourth connection; and the output signal has the second potential.

In accordance with another feature of the invention, a voltage having the first potential is connected to the first connection; a voltage having the third potential is connected to the second connection; a voltage having the second potential is connected to the third connection; a voltage having the first potential is connected to the fourth connection; and the output signal has the second potential.

In accordance with a further feature of the invention, a voltage having the third potential is connected to the first connection; a voltage having the first potential is connected to the second connection, the third connection and the fourth connection; and the output signal has the third potential.

In accordance with a further added feature of the invention, a sixth transistor of the first conduction type connects the first transistor to the second transistor; the first circuit node connects the sixth transistor to the second transistor; and the sixth transistor has a control connection connected to a voltage having the second potential.

In accordance with a further added feature of the invention, there is provided, a decoder group containing two of the inventive decoder elements. The third and fourth connections are connected to one another in each case. The decoder group advantageously permits the production of two output signals at two different outputs, each having three different potentials.

In accordance with a concomitant feature of the invention, there is provided, a decoder circuit containing two of the inventive decoder groups. The fourth connections of all four decoder elements are connected to one another, and the decoder circuit advantageously permits the production of four output signals at four outputs, each having three different potentials.

Other features which are considered as characteristic for the invention are set forth in the appended claims.

Although the invention is illustrated and described herein as embodied in a Decoder element for producing an output signal having three different potentials, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
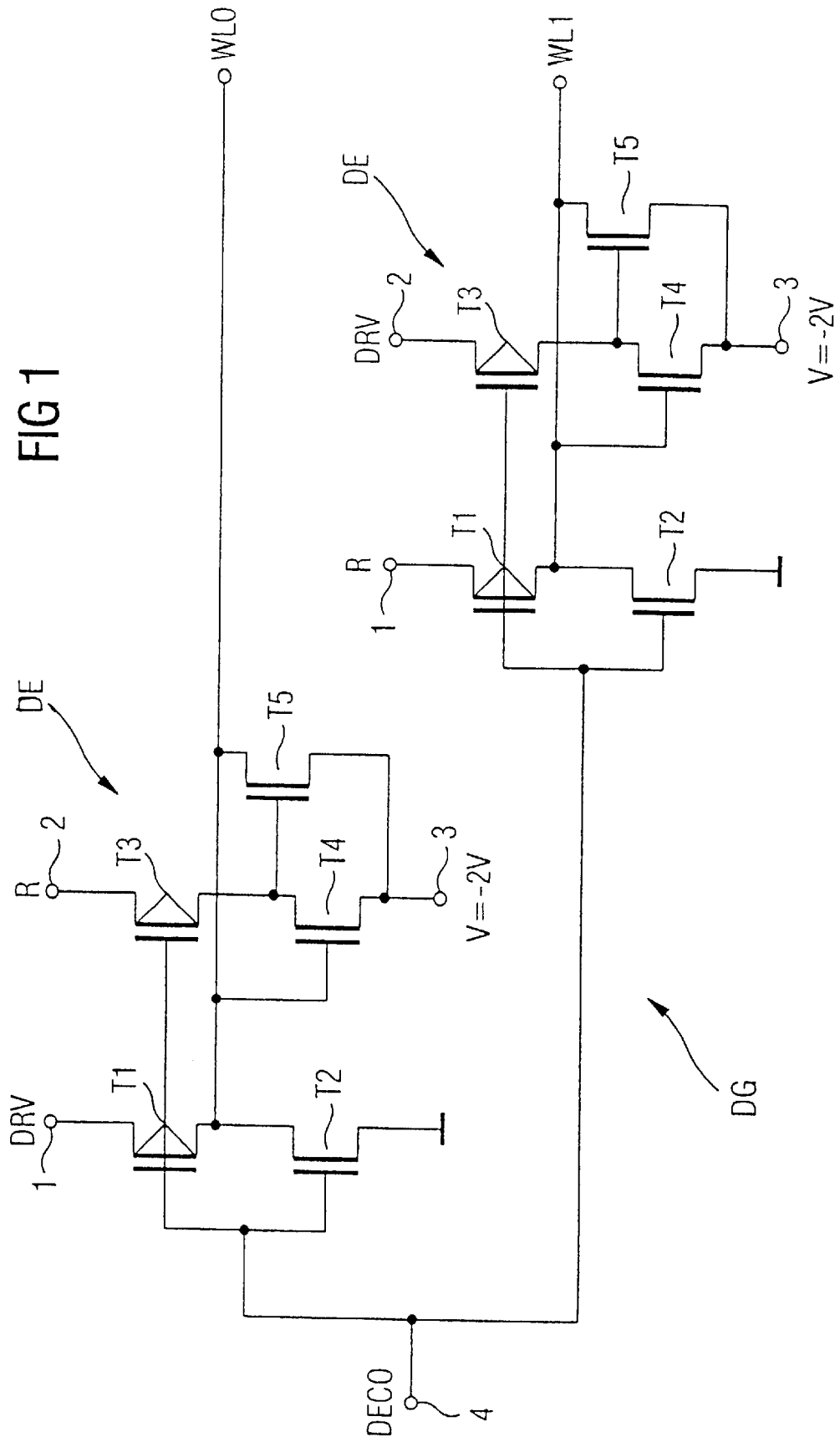
FIG. 1 shows an illustrative embodiment of a decoder group containing two decoder elements.

Referring now to the figures of the drawing in detail and first, particularly, to FIG. 1 thereof, there is shown a decoder group DG containing two decoder elements DE, each having an output WL0, WL1. Each decoder element DE has a series circuit including a first transistor T1 of the p-channel type and a second transistor T2 of the n-channel type. The series circuit is connected between a first connection 1 and ground (0V). The drains of the two transistors T1, T2 are connected to the output WLi of the decoder element DE. In addition, a second connection 2 of each decoder element DE is connected to a third connection 3 via a third transistor T3 of the p-channel type and a fourth transistor T4 of the n-channel type. A potential of −2V is applied to each of the third connections 3 in this illustrative embodiment. The gate of the fourth transistor T4 is connected to the output WLi. In addition, the output WLi is connected to the third connection 3 via a fifth transistor T5 of the n-channel type. The gate of the fifth transistor T5 is connected to the drains of the third transistor T3 and the fourth transistor T4. A fourth connection 4 of each decoder element DE is connected to the gates of the first transistor T1, the second transistor T2 and the third transistor T3. In the illustrative embodiment shown in FIG. 1, the fourth connections 4 of the two decoder elements DE are connected to one another.

Figures 5, 6, 7:
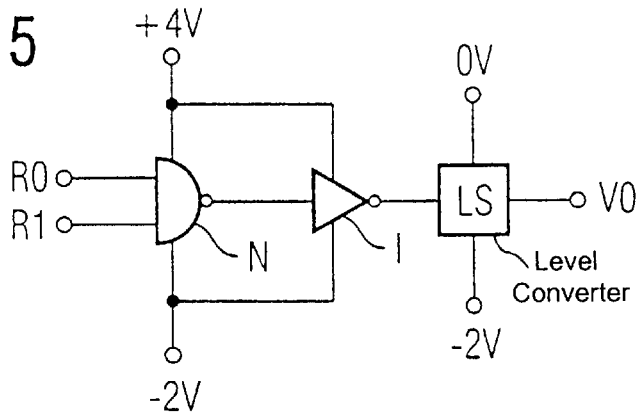
FIG. 5 shows an illustrative embodiment of a circuit for producing a potential on a third connection of the decoder elements shown in FIG. 3.
FIG. 6 shows potentials on connections of the decoder elements shown in FIG. 1 for producing three different potentials at the outputs of the decoder elements.
FIG. 7 shows potentials on the connections of the decoder elements shown in FIG. 3 for producing three different potentials at the outputs of the decoder elements.

Each decoder element DE from FIG. 1 is used to produce an output signal at its respective output WLi, the output signal being able to assume three different potentials based upon the signals on the four connections 1, 2, 3, 4. FIG. 6 shows these output signals being produced based upon the input signals on the connections. Since the potential on the third connection 3 is constantly at −2V in this illustrative embodiment, it has not been shown separately in FIG. 6.

FIG. 6 shows that a potential of 0V is produced at the output WLi when 4V is applied to the fourth connection 4 (decoder element deactivated) and potentials which are at most 4V plus the threshold voltage $U_T$ of the first transistor T1 or the third transistor T3 are applied to the first connection 1 and to the second connection 2.

As soon as the potential on the fourth connection 4 changes to −2V, the decoder element DE is activated, and the potential at the output WLi becomes dependent on the potentials on the first connection 1 and the second connection 2. If 4V and −2V are then applied to the first connection 1 and to the second connection 2, respectively, a potential of 4V is produced at the output WLi. If, when the decoder element DE has been activated, −2V and 4V are applied to the first connection 1 and to the second connection 2, respectively, a potential of −2V is produced at the output WLi.

The way in which the decoder element DE in FIG. 1 works is as follows: if 4V is applied to the fourth connection 4, the first transistor T1 and the third transistor T3 turn off, provided that no potential which is higher than 4V plus the threshold voltage of the respective transistors is applied to the first connection 1 and the second connection 2. At the same time, the second transistor T2 is turned on, so that it applies ground (0V) to the output WLi. Since the gate of the fourth transistor T4 is connected to the output WLi, ground is also applied to the gate of the fourth transistor T4, so that the latter is on. This means that the potential V=−2V on the third connection 3 is applied to the gate of the fifth transistor T5. Hence, the fifth transistor T5 is off, and the third connection 3 is electrically isolated from the output WLi.

If −2V and 4V are applied to the fourth connection 4 and to the first connection 1, respectively, and −2V is applied to the second connection 2, the first transistor T1 is on, while the second transistor T2 and the third transistor T3 are off. Hence, 4V is applied to the output WLi, which means that the fourth transistor T4 is also turned on. Hence, the potential V=−2V is again applied to the gate of the fifth transistor, so that the latter is off.

If a potential of −2V is applied to the fourth connection 4, −2V is applied to the first connection 1, and 4V is applied to the second connection 2, the third transistor T3 is on, while the first transistor T1 and the second transistor T2 are off. Hence, 4V is applied to the gate of the fifth transistor T5, so that the latter is turned on and connects the third connection 3 to the output WLi. The output WLi therefore assumes a potential of −2V, which means that the fourth transistor T4 is turned off at the same time.

In the illustrative embodiment of FIG. 1, an output signal having a potential of 0V is produced at both outputs WL0, WL1 for a potential of 4V on the fourth connection 4. If the decoder elements DE are activated by a potential of −2V on the fourth connection 4, a potential of 4V is produced at one output WL0, and a potential of −2V is produced at the other output WL1, or vice versa, since in this illustrative embodiment the first connection 1 of the top decoder element DE is connected to the second connection 2 of the bottom decoder element DE, and the second connection 2 of the top decoder element is connected to the first connection 1 of the bottom decoder element. This is thus an advantageous way of producing mutually complementary potentials at the outputs WL0, WL1 when the decoder elements DE have been activated.

A first signal DRV is supplied to the first connection 1 of the top decoder element and to the second connection 2 of the bottom decoder element DE. A second signal R is supplied to the second connection 2 of the top decoder element and to the first connection 1 of the bottom decoder element DE. A third signal DEC0 is supplied to the fourth connection 4.

Figure 2:
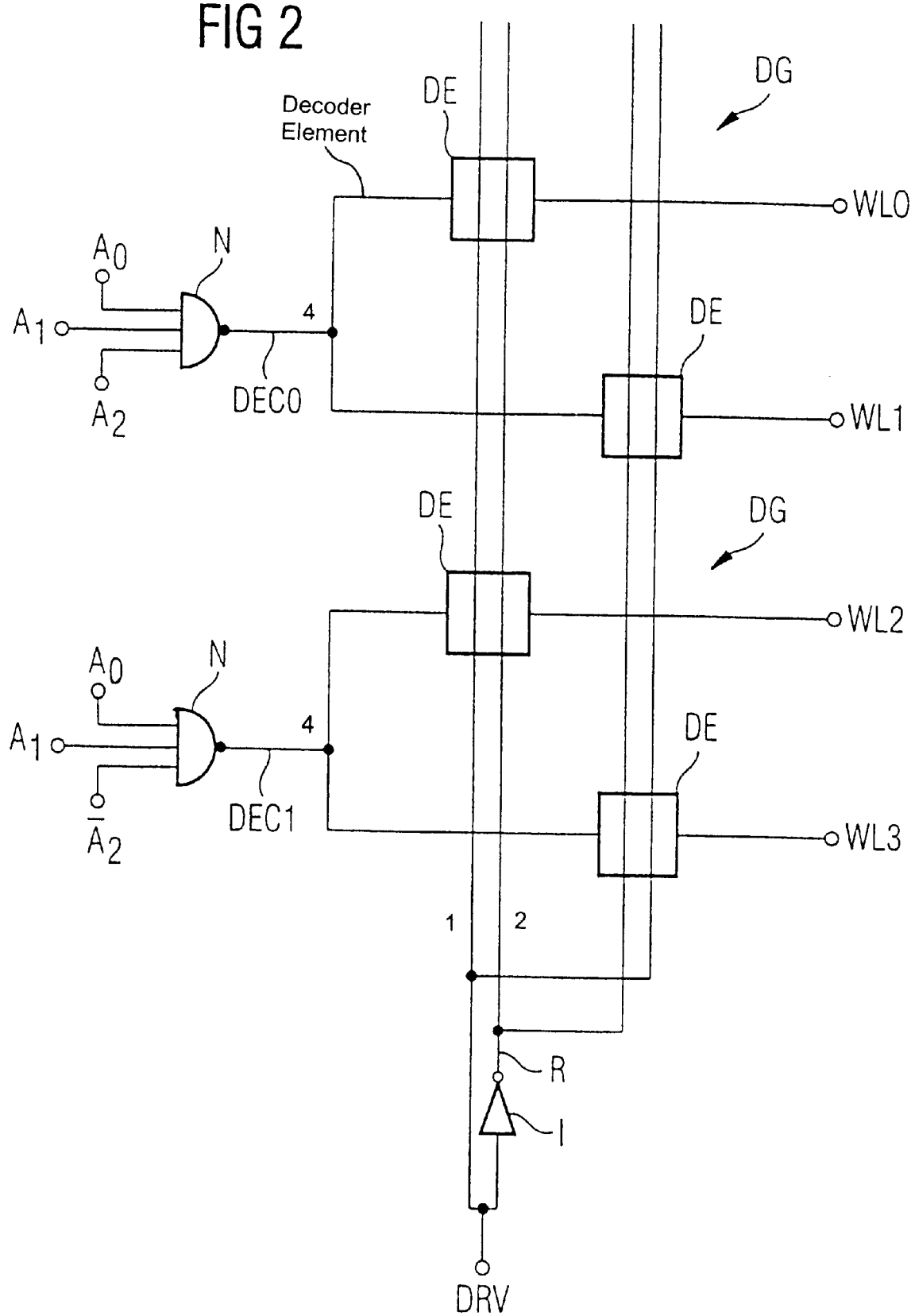
FIG. 2 shows an illustrative embodiment of a decoder circuit containing two decoder groups as shown in FIG. 1.

FIG. 2 shows a decoder circuit containing two decoder groups DG as shown in FIG. 1. Each decoder group DG thus has two of the decoder elements DE. The two decoder groups DG are of identical design. Their first connections 1 and second connections 2 also have the first signal DRV and the second signal R supplied to them in the manner shown in FIG. 1. However, the fourth connection 4 of the top decoder group DG in FIG. 2 has a third signal DEC0 supplied to it, which is different than the third signal DEC1 for the bottom decoder group DG. In this illustrative embodiment, the third signals DEC0, DEC1 from FIG. 2 are generated from three address bits $A_0$, $A_1$, $A_2$ using NAND gates N. Whereas the top third signal DEC0 has a low level of −2V only when the three address bits $A_0$, $A_1$, $A_2$ have a high level, the bottom third signal DEC1 in FIG. 2 has a low level of −2V only when the first two address bits $A_0$, $A_1$ have a high level and the third address bit $A_2$ has a low level. The address bits $A_0$, $A_1$, $A_2$ are thus used to activate and deactivate the respective decoder group DG.

FIG. 2 also shows that the second signal R is produced from the first signal DRV using an inverter I. In this illustrative embodiment, the first signal DRV and the second signal R can assume only one potential of either −2V or 4V. Hence, in each activated decoder group DG, the potential produced at one output WL0 is different than that at the other output WL1.

With a large number of decoder groups DG connected to the first signal DRV and to the second signal R, the decoder circuit in FIG. 2 can be used to deactivate all the decoder groups but one, so that a potential of 0V is produced at the two outputs of the deactivated decoder groups. For the activated decoder group DG, a potential of 4V is produced at one output, and a potential of –2V is produced at the other output. The decoder circuits described here are advantageously suitable, by way of example, for driving word lines within an integrated memory, each of these word lines being connected to one of the outputs WLi. The decoder circuit is then a word line decoder for the integrated memory.

Figure 3:
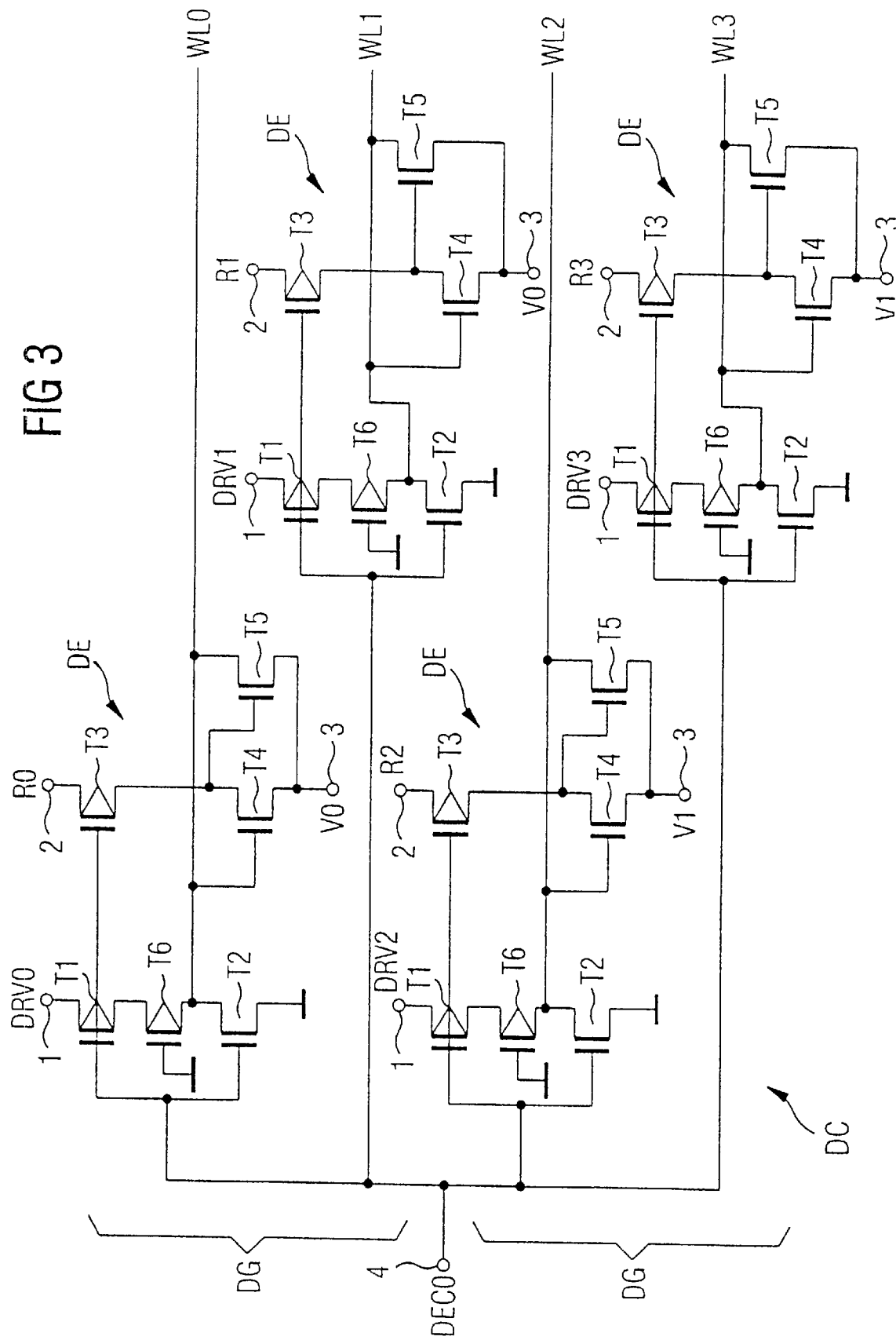
FIG. 3 shows another illustrative embodiment of a decoder circuit containing two decoder groups which have another illustrative embodiment of the decoder elements.

FIG. 3 shows another illustrative embodiment of part of a decoder circuit in which two respective decoder groups DG, each containing two decoder elements DE, have a common fourth connection 4. Each decoder element DE in FIG. 3 differs from the decoder elements in FIG. 1 only in the following points:

A sixth transistor T6 of the p-channel type is connected between the drain of the first transistor T1 and the drain of the second transistor T2. The gate of the sixth transistor T6 has a gate that is connected to ground. In addition, the third connections 3 of the decoder elements DE in the top decoder group DG are connected to a potential V0, and the third connections 3 of the decoder elements DE in the bottom decoder group DG are connected to a potential V1. A first signal DRVi is applied to the first connection 1 of each decoder element DE, and a second signal Ri is applied to the second connection 2.

FIG. 5 shows the potential that is produced on the third connection 3 of the decoder elements DE from FIG. 3. The potential V0 for the top decoder group DG from FIG. 3 is produced, as shown in FIG. 5, from the second signals R0, R1 of the two decoder elements DE thereof. The potential V1 on the third connection 3 of the decoder elements DE in the bottom decoder group DG from FIG. 3 is produced in an equivalent manner from the second signals R2, R3 thereof. As shown in FIG. 5, the second signals R0, R1 are connected to inputs of a NAND gate N, whose output is connected via an inverter I to a level converter LS whose output produces the potential V0 on the third connection 3. While the NAND gate N and the inverter I are powered by 4V and –2V, the level converter LS is powered by 0V and –2V, so that the potential V0 at its output assumes either 0V or –2V. The potential V0 is 0V when the two second signals R0, R0 have a high level of 4V. As soon as one of the second signals R0, R1 has a low level of –2V, the potential V0 also assumes the value –2V.

FIG. 7 shows the potentials produced at the outputs WLi of the decoder elements DE from FIG. 3 based upon the potentials on the connections 1, 2, 3, 4. A high level of the potential on the fourth connection 4 of 4V again deactivates the decoder element DE, provided that the potentials on the first connection 1 and the second connection do not exceed 4V plus the threshold voltage $U_T$ of the respective transistor T1, T3. In this case, the potential Vi on the third connection 3 can be unspecified. A potential of 0V is then produced at the respective output WLi.

If the decoder element DE is activated by virtue of the potential on its fourth connection 4 assuming a low level of –2V, the potential at the output WLi is dependent on the potentials on the first connection 1, the second connection 2 and the third connection 3. If 4V is applied to the first connection 1, –2V is applied to the second connection 2 and –2V is applied to the third connection 3, a potential of 4V is produced at the output WLi. If –2V is applied to the first connection 1 and to the third connection 3, and 4V is applied to the second connection 2, –2V is produced at the output WLi. If –2V is applied to the first connection 1, 4V is applied to the second connection 2, and 0V is applied to the third connection 3, 0V is produced at the output WLi.

The way in which the decoder elements DE work when producing the output potentials just described is principally equivalent to the way in which the decoder elements from FIG. 1 work. However, the sixth transistor T6 in FIG. 3 serves to ensure that, with the decoder element activated (potential on fourth connection 4=–2V) and with –2V applied to the first connection 1, 4V to the second connection 2, and 0V to the third connection 3, the potential of 0V which is then connected to the output WLi via the turned-on fifth transistor T5 is not applied directly to the drain of the first transistor T1, which would otherwise turn the latter on. In this situation, the sixth transistor T6 is off and ensures that the output WLi remains electrically isolated from the drain of the first transistor T1.

The decoder circuit DC shown in FIG. 3 makes it possible, with the decoder elements DE activated (potential on the fourth connection 4=–2V), to produce a potential of 0V at the bottom two outputs WL2, WL3, for example, by virtue of the associated second signals R2, R3 assuming a high potential of 4V, and at the same time to produce mutually complementary potentials of –2V and 4V at the two top outputs WL0, WL1 by virtue of the second signals R0, R1 thereof assuming potentials which are different than one another.

Figure 4:
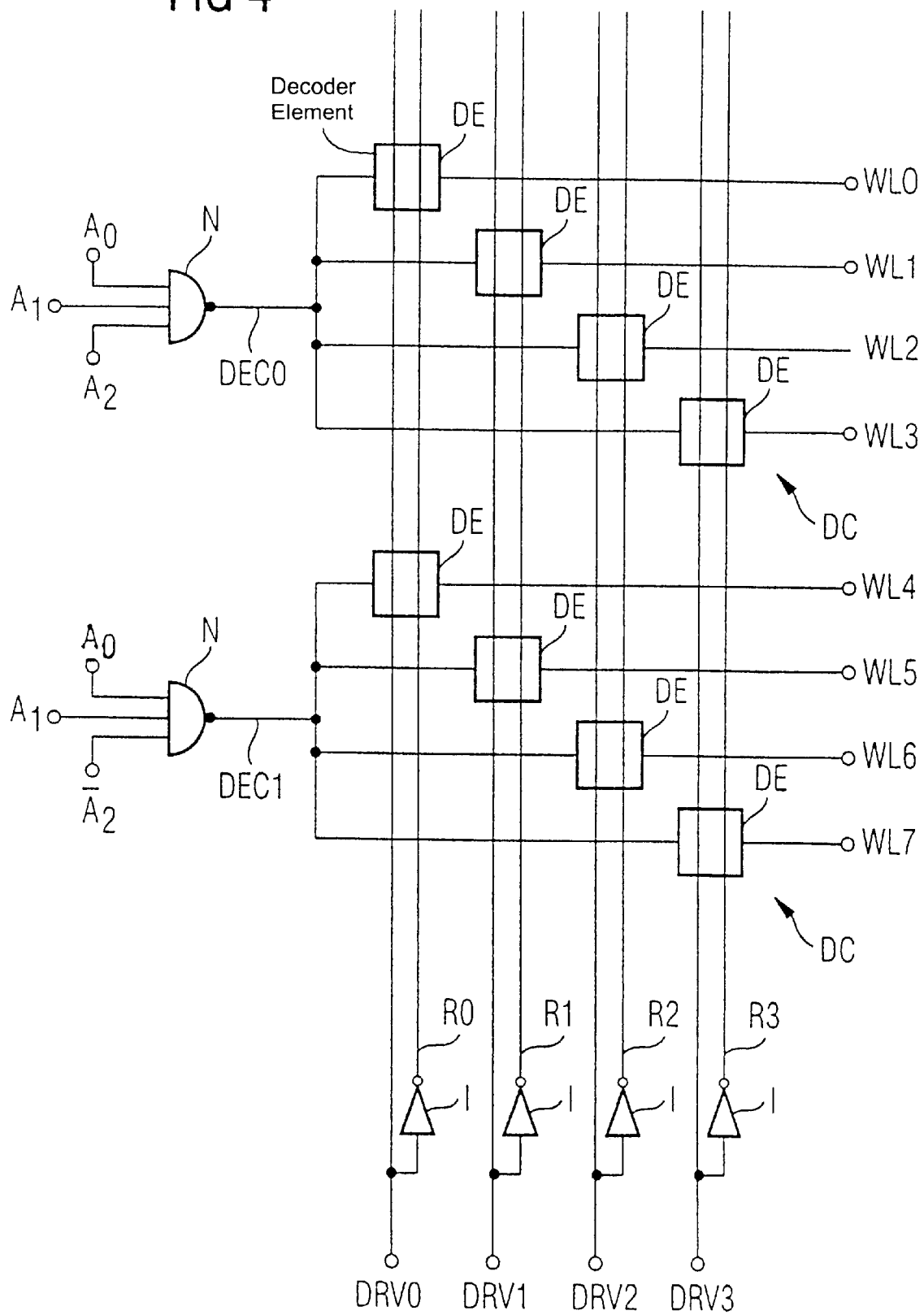
FIG. 4 shows a decoder circuit containing two decoder circuits as shown in FIG. 3.

FIG. 4 shows a decoder arrangement containing two decoder circuits DC as shown in FIG. 3. The way in which this arrangement works is essentially equivalent to the way in which the illustrative embodiment from FIG. 2 works. For this reason, a detailed explanation of this is not given again here. In this illustrative embodiment, four first signals DRVi are required, from which the respectively associated second signal Ri is produced using inverters I. FIG. 4 shows that the decoder arrangement can be extended as desired by adding further decoder circuits DC of the same type. It is also possible to extend the decoder circuits DC shown in FIG. 3 by adding further decoder groups DG having respectively separate first signals DRVi and second signals Ri.

One advantage of the decoder elements according to the invention is that the three output potentials are produced at the outputs WLi without any bootstrap effect. The decoder elements can therefore be operated statically.

We claim:

1. A decoder element for producing an output signal having three different potentials, comprising:

an output for providing an output signal with three different potentials which include a first potential, a second potential, and a third potential, the second potential being between the first potential and the third potential;

a first circuit node connected to said output;

a second circuit node;

a first transistor of a first conduction type and a second transistor of a second conduction type connected together through said first circuit node, said first transistor having a control connection and said second transistor having a control connection;

a first connection connected, through said first transistor and said second transistor, to a voltage having the second potential;

a third transistor of said first conduction type and a fourth transistor of said second conduction type connected together through said second circuit node, said third transistor having a control connection, said fourth transistor having a control connection connected to said output;

a second connection and a third connection, said second connection connected, through said third transistor and said fourth transistor, to said third connection;

a fourth connection connected to said control connection of said first transistor, said control connection of said second transistor, and said control connection of said third transistor; and a fifth transistor of said second conduction type connected between said output and said third connection, said fifth transistor having a control connection connected to said second circuit node.

2. The decoder element according to claim 1, wherein:

a voltage having the third potential is connected to said second connection;

a voltage having the first potential is connected to said first connection, said third connection, and said fourth connection; and said output signal has said first potential.

3. The decoder element according to claim 1, wherein:

said first transistor has a threshold voltage and said second transistor has a threshold voltage;

a voltage is connected to said first connection that has a potential that is lower than the third potential plus the threshold voltage of said first transistor;

a voltage is connected to said second connection that has a potential that is lower than the third potential plus the threshold voltage of said third transistor;

a voltage having the third potential is connected to said fourth connection; and said output signal has said second potential.

4. The decoder element according to claim 1, wherein:

a voltage having the first potential is connected to said first connection;

a voltage having the third potential is connected to said second connection;

a voltage having the second potential is connected to said third connection;

a voltage having the first potential is connected to said fourth connection; and said output signal has the second potential.

5. The decoder element according to claim 1, wherein:

a voltage having the third potential is connected to said first connection;

a voltage having the first potential is connected to said second connection, said third connection and said fourth connection; and said output signal has the third potential.

6. The decoder element according to claim 1, comprising:

a sixth transistor of the first conduction type connecting said first transistor to said second transistor;

said first circuit node connecting said sixth transistor to said second transistor; and said sixth transistor having a control connection connected to a voltage having the second potential.

7. A decoder group, comprising:

a first decoder element and a second decoder element;

said first decoder element and said second decoder element each including:

an output for providing an output signal with three different potentials which include a first potential, a second potential, and a third potential, the second potential being between the first potential and the third potential;

a first circuit node connected to said output;

a second circuit node;

a first transistor of a first conduction type and a second transistor of a second conduction type connected together through said first circuit node, said first transistor having a control connection and said second transistor having a control connection;

a first connection connected, through said first transistor and said second transistor, to a voltage having the second potential;

a third transistor of said first conduction type and a fourth transistor of said second conduction type connected together through said second circuit node, said third transistor having a control connection, said fourth transistor having a control connection connected to said output;

a second connection and a third connection, said second connection connected, through said third transistor and said fourth transistor, to said third connection;

a fourth connection connected to said control connection of said first transistor, said control connection of said second transistor, and said control connection of said third transistor; and a fifth transistor of said second conduction type connected between said output and said third connection, said fifth transistor having a control connection connected to said second circuit node; and said third connection of said first decoder element connected to said third connection of said second decoder element; and said fourth connection of said first decoder element connected to said fourth connection of said second decoder element.

8. The decoder group according to claim 7, wherein:

said first connection of said first decoder element is connected to said second connection of said second decoder element; and said second connection of said first decoder element is connected to said first connection of said second decoder element.

9. A decoder circuit, comprising:

a first decoder group and a second decoder group;

said first decoder group including a first decoder element and a second decoder element;

said second decoder group including a first decoder element and a second decoder element;

said first decoder element of said first decoder group, said second decoder element of said first decoder group, said first decoder element of said second decoder group, and said second decoder element of said second decoder group, each including:

an output for providing an output signal with three different potentials which include a first potential, a second potential, and a third potential, the second potential being between the first potential and the third potential;

a first circuit node connected to said output;

a second circuit node;

a first transistor of a first conduction type and a second transistor of a second conduction type connected together through said first circuit node, said first transistor having a control connection and said second transistor having a control connection;

a first connection connected, through said first transistor and said second transistor, to a voltage having the second potential;

a third transistor of said first conduction type and a fourth transistor of said second conduction type connected together through said second circuit node, said third transistor having a control connection, said fourth transistor having a control connection connected to said output;

a second connection and a third connection, said second connection connected, through said third transistor and said fourth transistor, to said third connection;

a fourth connection connected to said control connection of said first transistor, said control connection of said second transistor, and said control connection of said third transistor; and a fifth transistor of said second conduction type connected between said output and said third connection, said fifth transistor having a control connection connected to said second circuit node;

said third connection of said first decoder element of said first decoder group connected to said third connection of said second decoder element of said first decoder group;

said third connection of said first decoder element of said second decoder group connected to said third connection of said second decoder element of said second decoder group; and said fourth connection of said first decoder element of said first decoder group, said fourth connection of said second decoder element of said first decoder group, said fourth connection of said first decoder element of said second decoder group, and said fourth connection of said second decoder element of said second decoder group connected together.

* * * * *